(12) United States Patent
Chiang (10) Patent No.: US 8,362,490 B2
(45) Date of Patent: Jan. 29, 2013

(54) LIQUID CRYSTAL PANEL WITH CONDUCTIVE CARBON LINE

(76) Inventor: Kuo-Ching Chiang, Taipei (TW)

( * ) Notice: Subject to any disclaimer, the term of this patent is extended or adjusted under 35 U.S.C. 154(b) by 12 days.

(21) Appl. No.: 12/880,177

(22) Filed: Sep. 13, 2010

(65) Prior Publication Data

US 2010/0328566 A1 Dec. 30, 2010

Related U.S. Application Data

(63) Continuation-in-part of application No. 12/076,928, filed on Mar. 25, 2008, now abandoned.

(30) Foreign Application Priority Data

Mar. 26, 2007 (TW) ................................ 96110424 A (51) Int. Cl.
*H01L 27/14* (2006.01)

(52) U.S. Cl. .......................................... 257/72; 977/742
(58) Field of Classification Search .................... 257/72; 977/742

See application file for complete search history.

(56) References Cited

U.S. PATENT DOCUMENTS

| 5,879,992 | A | 3/1999 | Hsieh et al. |
| 6,667,508 | B2 | 12/2003 | Lin et al. |
| 6,936,190 | B2 * | 8/2005 | Yoshida ........................ 252/511 |
| 7,482,653 | B2 | 1/2009 | Sandhu et al. |
| 7,652,280 | B2 * | 1/2010 | Li et al. ............................ 257/13 |
| 2009/0002266 | A1 * | 1/2009 | Li et al. ............................. 345/6 |
| 2010/0224862 | A1 * | 9/2010 | Endoh et al. .................... 257/24 |

* cited by examiner

*Primary Examiner* — Douglas Menz
(74) *Attorney, Agent, or Firm* — Bui Garcia-Zamor; Jessica H. Bui, Esq.

(57) ABSTRACT

A display unit comprises a first polarizer; a first transparent substrate is formed over the first polarizer; a first transparent electrode is successively formed over the first transparent substrate, the first transparent electrode is selected from a group consisting of conductive carbon, conductive polymer and the combination thereof. A TFT (thin film transistor) is next formed over the first transparent electrode; liquid crystals are formed over the TFT and a second transparent electrode is formed over the liquid crystals, the second transparent electrode is selected from a group consisting of the conductive carbon, conductive polymer and the combination thereof. A second transparent substrate formed over the second transparent electrode and a color filter is formed over the second transparent substrate. A second polarizer is successively formed over the color filter.

12 Claims, 5 Drawing Sheets

LIQUID CRYSTAL PANEL WITH CONDUCTIVE CARBON LINE

CROSS-REFERENCE TO RELATED APPLICATION

This application is a divisional of an application Ser. No. 12/076,928, filed on Mar. 25, 2008, now pending, which is a counterpart foreign application of TAIWAN Patent Application No. 096110424, filed on Mar. 26, 2007. The contents of the above-mentioned patent applications is hereby incorporated by reference herein in its entirety and made a part of this specification.

TECHNICAL FIELD

The present invention relates to a liquid crystal panel, and more specifically, to a liquid crystal panel with conductive carbon (or conductive polymer) on channel and electrical transparent electrode.

BACKGROUND

The liquid crystal display (LCD) which had replaced the traditional cathode ray tube (CRT) display extensively in the computer, communication and consumer electronics industry. It also meets some issues during the minimization of the devices. Compared to the traditional CRT display, LCD display has the advantages of being thinner and lighter with low radiation. The LCD displayer uses a plurality of driver circuit disposed on the panel to applied different voltage altering the arrangement of liquid crystal cell within the panel in either upright or twisted orientation. The arrangement of liquid crystal cell defines the light gate to determine the transmissivity of the backlight source to the screen and construct the entire image frame. Generally, each pixel of LCD panel is provided with two input ends to couple respectively with two different driver circuits, one is the source driver circuit disposed laterally along the X axis of LCD panel, one is the gate driver circuit disposed longitudinally along the Y Axis of LCD panel, wherein source driver circuit is a component having high-frequency characteristics and display function used to transmit the image data to LCD panel and control the data input. In order to increase the number of the pixels for the panel, the cells and the lines should be formed as smaller as possible. However, the narrower the lines are, the higher the resistance is. It results that the performance is reduced.

SUMMARY

A display unit comprises a first polarizer; a first transparent substrate is formed over the first polarizer; a first transparent electrode is successively formed over the first transparent substrate, the first transparent electrode is selected from a group consisting of conductive carbon, conductive polymer and the combination thereof. A TFT (thin film transistor) is next formed over the first transparent electrode; liquid crystals are formed over the TFT and a second transparent electrode is formed over the liquid crystals, the second transparent electrode is selected from a group consisting of the conductive carbon, conductive polymer and the combination thereof. A second transparent substrate formed over the second transparent electrode and a color filter is formed over the second transparent substrate. A second polarizer is successively formed over the color filter. The TFT includes a gate and an isolation layer which is formed over the gate, a conductive carbon material with nano-scale is configured over the isolation and aligned to the gate, a source and a drain (S/D) are substantially covers terminals of the conductive carbon material with nano-scale.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION

The present invention proposes a novel method to fabricate a memory. In the method, the operation speed for storing data can be increased by the cell structure. The detail description will be illustrated as follows. A semiconductor substrate is provided for the present invention. In a preferred embodiment, as shown in the FIG. 1, a single crystal silicon substrate 20 crystallographic orientation is provided. The substrate 20 includes a pattern of active areas comprising separated doped region such as the source/drain regions. A thin dielectric layer 22 is formed on the substrate 20 to act as gate dielectric layer. Typically, the dielectric layer 22 can be grown in oxygen ambient at a temperature of about 700 to 1100 degrees centigrade. Other method, such as chemical vapor deposition, can also form the oxide. Subsequently, a conductive layer 24 is formed on the oxide 22 to act the floating gate. The conductive layer 24 may be formed of doped polysilicon, in-situ doped polysilicon.

Figure 1:
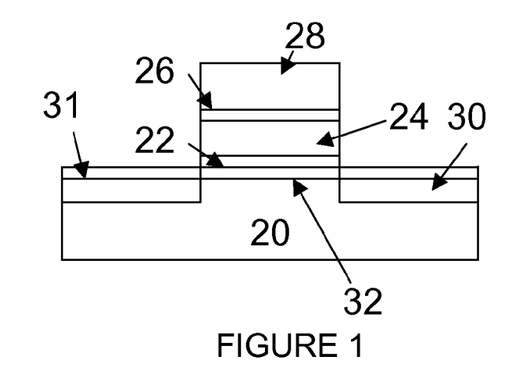
FIG. 1 is a cross sectional view of a semiconductor wafer illustrating the memory according to the present invention.

For the illustration of an embodiment, the doped polysilicon layer 20 is doped by phosphorus using a PH3 source. An isolation layer 26 is conformally formed on the substrate 20 and the gate structure. The material for forming the isolation layer 26 can be nitride, oxide ($SiO_2$) or ($HfO_2$), ($ZrO_2$)), ($TiO_2$), (HfTiO), (HfAlO), ($La_2O_3$), (LaAlO). One suitable method for the oxide layer includes thermal oxidation and deposition by CVD. For example, Low Pressure Chemical Vapor Deposition (LPCVD), Plasma Enhance Chemical Vapor Deposition (PECVD), High Density Plasma Chemical Vapor Deposition (HDPCVD). The control gate 28 is formed on the isolation layer. A photo-resist pattern is formed on the stacked layers, followed by etching the layers by using the photo-resist pattern as etching mask, thereby forming the gate structure on the silicon substrate 20.

Figure 2:
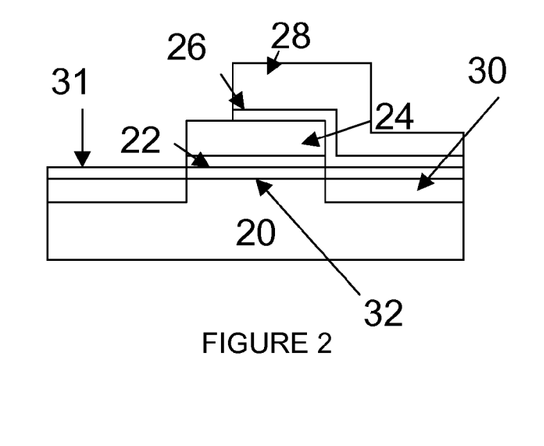
FIG. 2 is a cross sectional view of a semiconductor wafer illustrating the memory according to the present invention.

Next, the stacked gate is used as mask to perform the ion implantation for forming the source/drain 30 adjacent to the gate, as shown in FIG. 1. FIG. 2 is similar structure to the last embodiment. The structure in FIG. 2 is called split-gate structure to distinguish the stacked gate. The control gate shifts from the floating gate with a distance and overlaps a part of the floating gate. It should be noted that the spacers may be formed on the sidewall of the gate structure and the dosage type and profile may be changed, such as the structure may have the LDD, halo-implant, or pocket implantation. Another embodiment is shown. Most of the structure is similar to FIG. 1. An oxidation is performed to the floating gate to oxide the upper surface of the floating gate to form thick oxide 29, thereby forming peak at the corner to increase the erasing speed.

Figure 10:
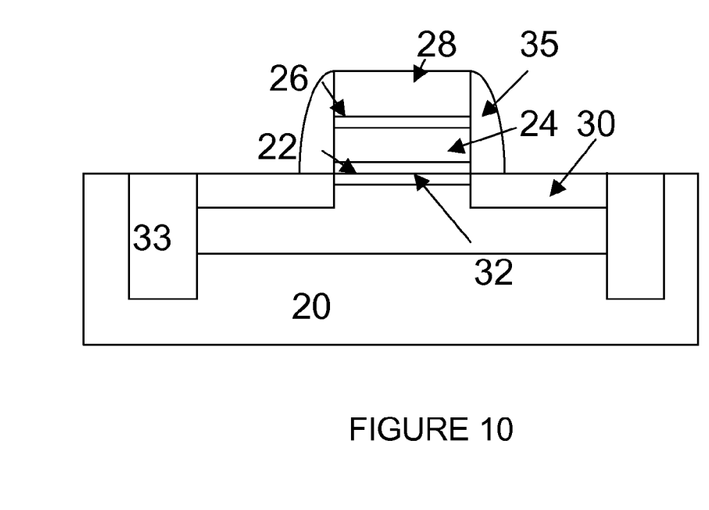
FIG. 10 is a cross sectional view of a semiconductor wafer illustrating the memory according to the present invention.

At least one conductive carbon 32, for instance, carbon nano-tube (CNT) 32 is located under the gate dielectric 22 of the dual-gates structure. Namely, the conductive carbon 32 connects the S/D 30. The CNT may be formed with at least one to fifty layers structure. The diameters of the CNT maybe 1-2 nanometers and the length is 10-100 nano-meters or shorter. The S/D 30 can be formed by deposition, sputter instead of implantation in order to form the CNT. Alternatively, the CNT 22 maybe keeps a distance with the oxide 22. The embodiment may be includes spacers such as FIG. 10.

The formation of CNT is to heat the organic compound having carbon to generate the carbon atoms. One example is to input the reaction gas such as CH4 to the reaction chamber, and the carbon atoms will be separated from the gas when the reaction gas contacts the high temperature substrate. The carbon will be growth. Another method is to drive the C—H compound with CH4 through the nanometers substrate. The conductive carbon has the characteristics of semiconductor property to improve the performance of the device and scaled down the size. During the operation, the carrier of the memory will flow through the tube.

Figure 3:
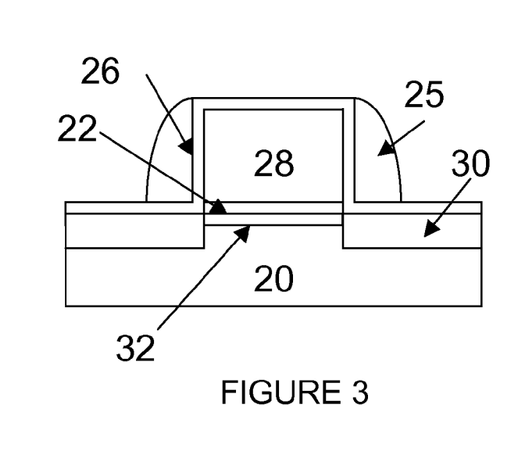
FIG. 3 is a cross sectional view of a semiconductor wafer illustrating the memory according to the present invention.

FIG. 3 is another embodiment that is multi-bits memory, a control gate 28 controls the carrier trapping structures 25. The carrier trapping structures are used to define the digital zero and one. The carrier trapping structure 25 is isolated from the sidewall of the control gate by the isolation layer 26. A dielectric layer 28 is conformally formed over the isolation layer 26, followed by isotropically etching the layer, thereby forming the spaces 28 to create the carrier trapping structure 25. The anisotropic etching includes RIE, plasma etching. Next, the S/D is formed 30. Similarly, the CNT 32 is formed prior art to form the control gate and the CNT connects the S/D 30.

The source and drain is formed by performing an ion implantation to dope ions into the substrate 201 using the gate structure 203a and sidewall spacers 206a as a mask. Silicide process may be used on the S/D 30 in each embodiment of the present invention. The material for the silicide maybe TiSi2, CoSi2NiSi. A typical silicide process is introduced on the exposed surface of the silicon substrate on the source and drain regions to reduce the resistance. The gate structure 203a is used as the control gate and the nitride spacers 25 acting as carrier trapping structure.

A sectional view of a two-bit nonvolatile memory cell in accordance with the present invention is shown in FIG. 3. The memory cell includes a substrate 201 having two buried PN junctions, one is the left junction and the other is the right junction. CNT Channels are located between the two junctions during operation. Above the main channel is oxide. On top of the oxide layer is a control gate. L-shape structure 25 is formed on the sidewall of the gate structure. The vertical portion of the L-shape structure 25 is attached on the side wall of the gate, and the lateral portion where tunneling will be occurred is formed on the substrate. Spacer 26 is used for charge trapping and is preferably comprised of silicon nitride. The hot electrons are trapped as they are injected into the Spacer 26.

The memory cell is capable of storing two bits of data, a right bit and a left bit. The two bit memory cell is a symmetrical device. The left junction serves as the source terminal and the right junction serves as the drain terminal for the right bit programming. Similarly, for the left bit programming, the right junction serves as the source terminal and the left junction serves as the drain terminal. The operating mode of the present invention for the right bit is to offer a bias Vgp is applied on the silicide over the gate structure for writing, the source node has 1 nA-1 mA current Isp. Channel hot carrier current is generated in the substrate 20 under the spacer 25 between the gate structure and the drain. The channel hot carrier current will injects into the spacer 25 via the lateral portion of the L-shape structure adjacent to the drain side due to the source, drain keep a distance from the channel under the gate. Electrons are trapped in the portion of nitride spacer near but above and self-aligned with the drain region because the strongest electric field forms there. The carriers are therefore stored in the nitride spacer 25 that functions as the floating gate of the nonvolatile memory.

Figure 11:
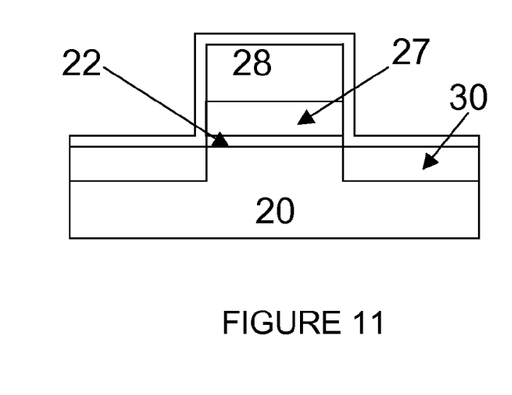
FIG. 11 is a cross sectional view of a semiconductor wafer illustrating the memory according to the present invention.

The nitride spacer 25 on the drain side is defined as "digital one", while the spacer without carrier therein on the drain side is referred to "digital zero". Hence, a set of memory unit "XY" is written as "X1" or "X0". It should be understood that the source and drain terminals for the second bit are reversed compared to the source and drain terminals for the first bit. Therefore, the data status can be programmed or defined as "00", "01", "10" or "11" by applying the drain-write voltage Vdp and source current Isp depending on the right bit cell or left bit cell. If the two-bits are desired to be programmed as "11", the drain-write voltage Vdp and source current Isp are introduced on the left bit and right bit, respectively. The cell is operated based upon "forward program and reverse read" scheme. The read current in the channel is reverse compared to the one of programming. The cell shows totally different channel sections, source/drain and SiN spacer arrangement. One of the key features is that the source/drain regions keep a distance to the channel under the gate. Under such arrangement, the present invention is capable of storing 4-bits information rather than two bits. Similarly, the digital data can be erased. In FIG. 11, the carrier trapping structure 27 is under the control gate 28, and it is consisted by ONO or ON.

Figure 4:
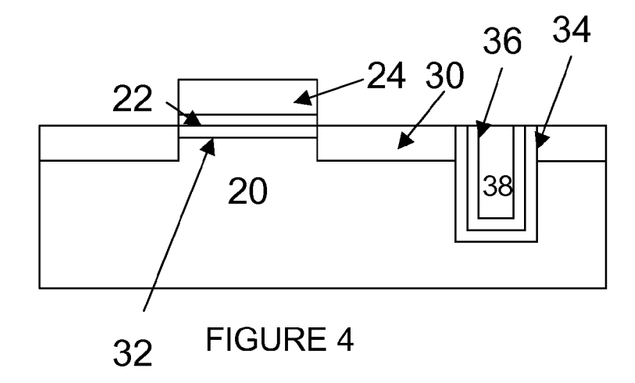
FIG. 4 is a cross sectional view of a semiconductor wafer illustrating the memory according to the present invention.

FIG. 4 illustrates CNT 32 located between the S/D of a memory. The drain 30 of the memory connects to a structure with conductive/isolation/conductive to store carriers. For example, the memory has a trench formed within the substrate. The conductive/isolation/conductive structure is formed within the trench from outer to inner portion. A first conductive layer 34 is connected to the drain 30. A CNT 32 is located between the drain and source to improve the operation speed. The isolation could be oxide, NO, ONO.

Figure 5:
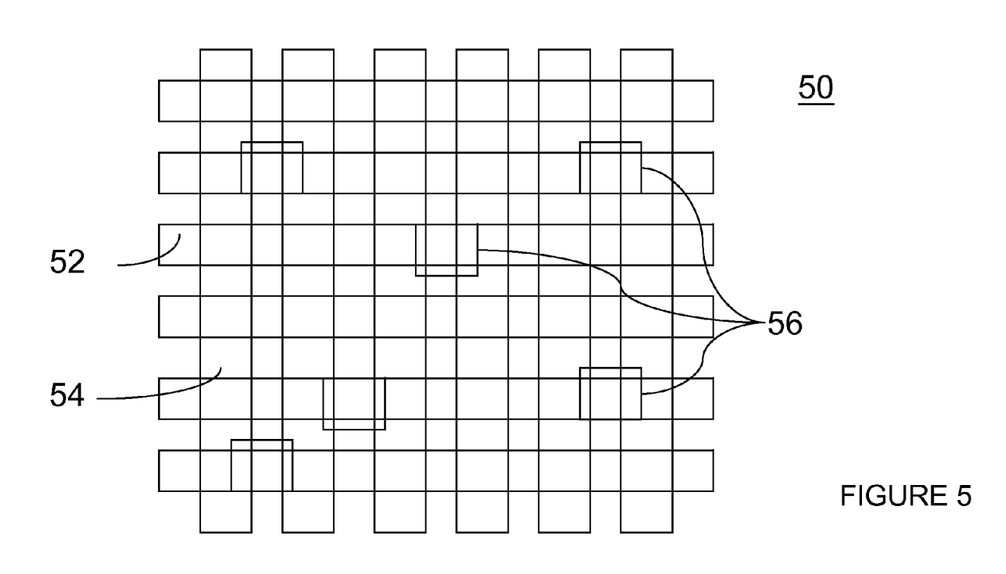
FIG. 5 is a top view of a semiconductor wafer illustrating the memory according to the present invention.
Figure 6:
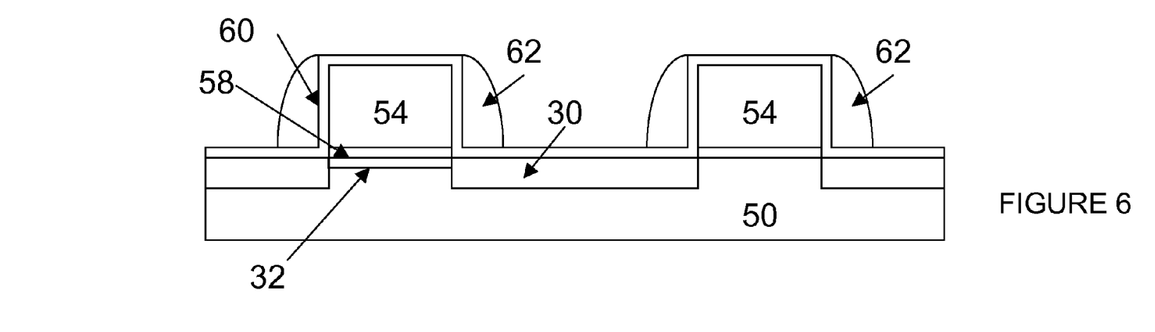
FIG. 6 is a cross sectional view of a semiconductor wafer illustrating the memory according to the present invention.

FIG. 5 is the ROM of the present invention. The ROM includes bit lines 52 arranged on the substrate 50, the bit lines 52 are typically formed by ion implantation, for instance, buried bit lines. Word lines (gates) 54 are formed over the substrate and vertically cross the bit lines 52 to construct a checkerboard configuration. The word lines 54 are perpendicular to the bit lines 52. At least one conductive carbon (such as CNT) is located a portions of the non-intercrossing area of the bit lines 52 and word lines 54 to act as the semiconductor area. The cross sectional view is shown in FIG. 6. It includes two kinds of devices on the substrate 50. Oxide layer 58 is under the gate 54 and a liner layer 60 may be formed along the gate structure. Spacers 62 is formed by the well-known manner on the gate 54. Conductive carbon such as CNT 32 is formed in one kind of the devices. Another one has no the CNT. Current will be generated along the CNT between the S/D. On the contrary, there is no current in another device. Therefore, the digital status can be determined by the configuration. The present invention provides a nano-scale ROM.

Figure 7:
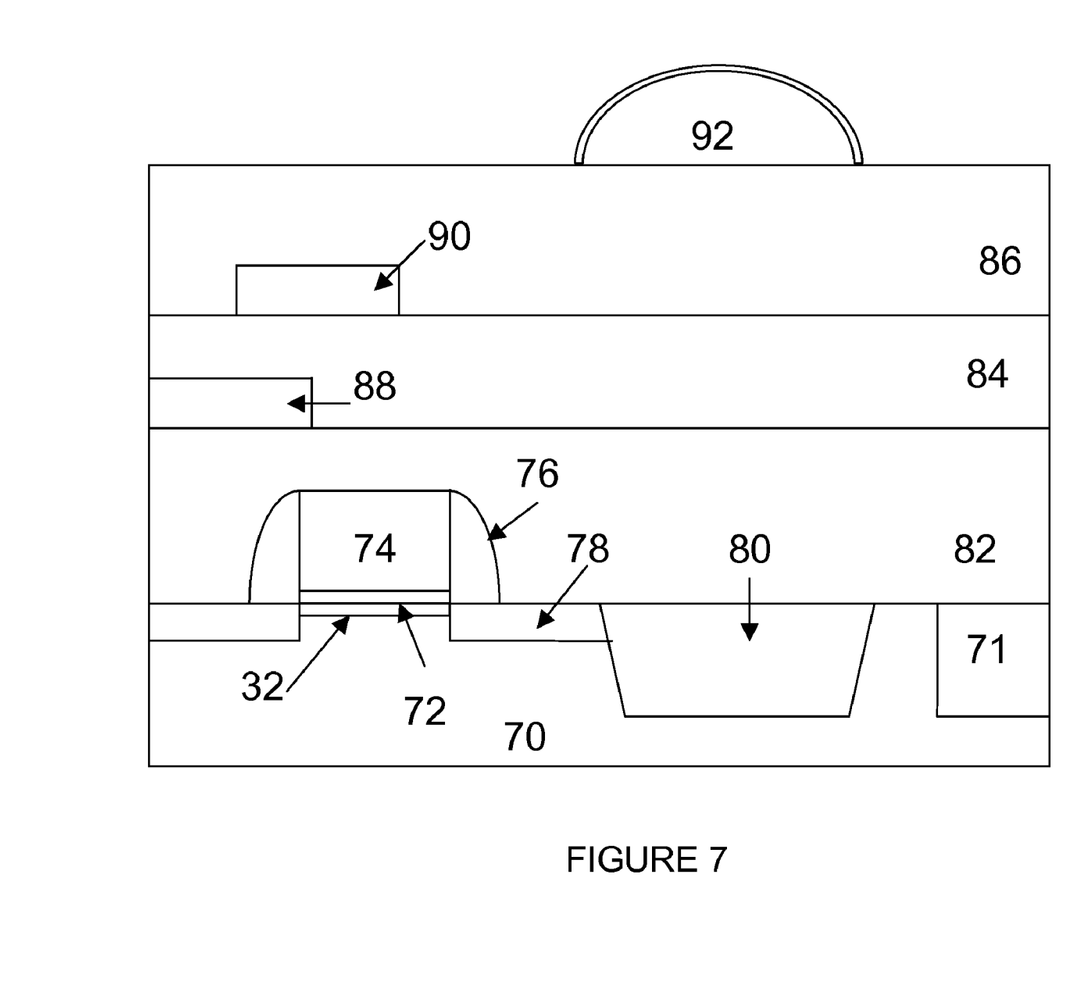
FIG. 7 is a cross sectional view of a semiconductor wafer illustrating the semiconductor device according to the present invention.

FIG. 7 illustrates an oxide 72, gate 74 are formed over the substrate. The gate structure includes spacer 76 on the side walls and doped regions 78 are formed in the substrate adjacent to the gate. The substrate includes an isolation region 71 that is formed by STI or FOX. A photo-diode implantation region 80 is formed in the substrate and connected to the doped regions 78 to receive photo. Conductive carbon, such as CNT 32 is formed under the gate and between the source and drain of the doped regions 78 to act the channel. The dosage of the ion implantation region of the photo-diode 80 is about 1E12-1E14/cm2, the energy of the implantation is about 50-180 keV. The surface of the doped region 80 can be formed with dosage about 1E15-1E16/cm2, the energy of the implantation is about 5-40 keV to prevent dark current. The above dosage, energy and doping type can be modified. Pluralities of isolation layers 82, 84, 86 are laminated over the conductive pattern 88, 90. A lens 92 is formed over the isolation layer to guide the incident line into the photo-diode region 80. The present invention may speed up the operation speed and prevent dark current.

Figure 8:
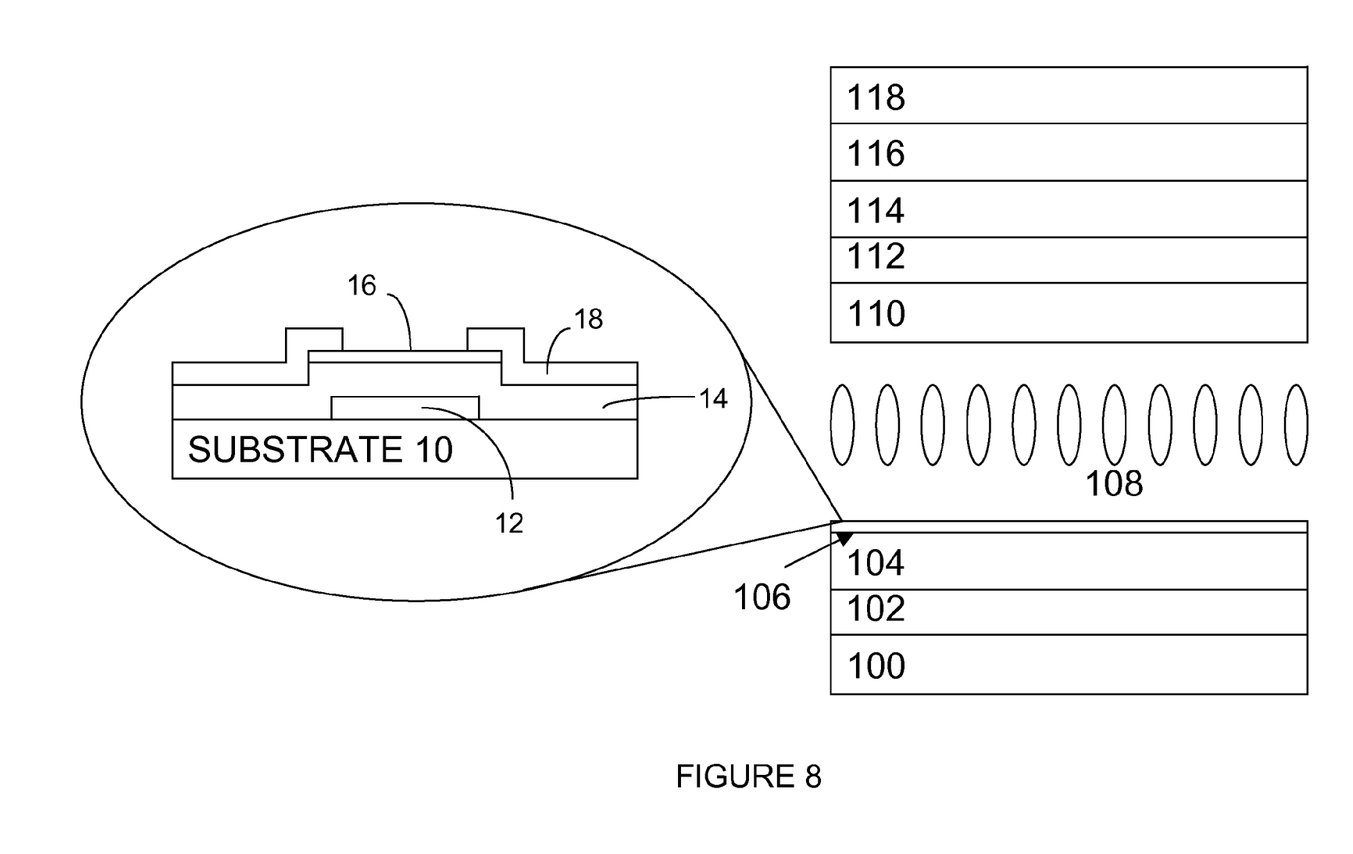
FIG. 8 is a cross sectional view of a semiconductor wafer illustrating the display module according to the present invention.
Figure 9:
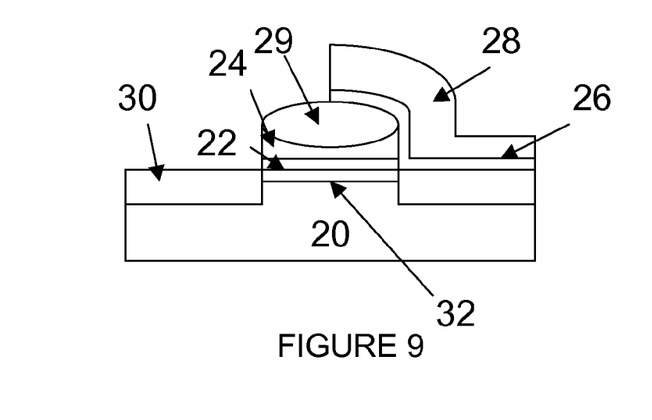
FIG. 9 is a cross sectional view of a semiconductor wafer illustrating the memory according to the present invention.

Another embodiment is illustrated in FIG. 8, which includes a display unit having a first (rear) polarizer 100, a first transparent (such as glass) substrate 102 and a first transparent electrode 104. A TFT is formed over the first transparent electrode 104. LC (liquid crystals) 108 is formed over the TFT 104. A second (front) transparent electrode 110 is formed over the LC 108 and a second (front) transparent substrate 112 and color filter 114 are subsequently formed over the LC 108. A protection glass 116 and second (front) polarizer 118 are formed over the color filter 114. The TFT 106 is formed over the substrate 10 and the gate 12 of the TFT is patterned and isolation layer 14 is formed over the gate 12. CNT 16 is configured over the isolation 14 and aligned to the gate 12 as a nano-scale channel. S/D (source and drain) 18 substantially covers the terminals of the CNT 16 and coupled to the S/D. Alternatively, the first and/or second transparent electrodes are formed by conductive carbon (such as CNT) and/or conductive polymer. It may be formed by print to simplify the process. As described above, the source electrode and the drain electrode 18 can be formed in a single-layered or multi-layered structure from a conductive carbon as well. The conductive carbon with nano-scale may reduce the width of the conductive electrode, thereby reducing the scale of electrode and increasing the resolution without down grade the performance.

The CNT and the conductive polymer have better conductivity than prior art even minimizing the size of the structure. It may improve the electronic transmitting rate with transparent characteristic when it is formed with thinner thickness. The transparent, conductive layer of CNT is coated with an ionic polymer, and the composite is used as a transparent electrode. The interaction between the polymer and the CNT in the conductive network is beneficial to the overall goal of forming useful coatings for numerous consumer devices. The CNT-polymer composite offers the characteristic of transparent and good conductivity. The method of forming CNT is illustrated above. In an embodiment of the present invention, a high density plasma CVD method maybe used, and an inductively coupled plasma (ICP) apparatus capable of generating high density plasma. Further, the present embodiment may use methane $CH_4$ together with He. In the present embodiment, the carbon nanotube film is grown with RF power fixed at 1 kW, at substrate temperature of 600 to 900.degree. C. Nitrogen gas or hydrogen gas can also be used to accelerate the reaction. When a carbon nanotube film is grown directly on the transparent electrodes 104, 110, or on the drain/source 18, or the channel 16, a catalytic metal layer (not shown) for growing carbon nanotubes can be formed on the surface of these portions. Alternatively, these area themself can be formed of catalytic metal.

As will be understood by persons skilled in the art, the foregoing preferred embodiment of the present invention is illustrative of the present invention rather than limiting the present invention. Having described the invention in connection with a preferred embodiment, modification will now suggest itself to those skilled in the art. Thus, the invention is not to be limited to this embodiment, but rather the invention is intended to cover various modifications and similar arrangements included within the spirit and scope of the appended claims, the scope of which should be accorded the broadest interpretation so as to encompass all such modifications and similar structures. While the preferred embodiment of the invention has been illustrated and described, it will be appreciated that various changes can be made therein without departing from the spirit and scope of the invention.

What is claimed is:

1. A display unit comprising:
   a first polarizer;
   a first transparent substrate formed over said first polarizer;
   a first transparent electrode formed over said first transparent substrate, wherein said first transparent electrode is selected from a group consisting of conductive carbon, conductive polymer and the combination thereof;
   a TFT (thin film transistor) formed over said first transparent electrode;
   liquid crystals formed over said TFT;
   a second transparent electrode formed over said liquid crystals, wherein said second transparent electrode is selected from a group consisting of said conductive carbon, conductive polymer and the combination thereof;
   a second transparent substrate formed over said second transparent electrode;
   a color filter formed over said second transparent substrate;
   a second polarizer formed over said color filter, wherein said conductive carbon or polymer with nano-scale reduces width of said first, and said second transparent conductive electrode, thereby increasing the resolution or improving transmitting rate.

2. The display unit of claim 1, wherein said conductive carbon includes carbon nano-tube.

3. The display unit of claim 1, wherein said TFT includes a gate, and an isolation layer is formed over said gate, a conductive carbon material with nano-scale is configured over said isolation and aligned to said gate to act as a channel.

4. The display unit of claim 3, wherein said conductive carbon includes carbon nano-tube.

5. The display unit of claim 3, wherein said TFT further includes a source and a drain (S/D) formed of conductive carbon.

6. The display unit of claim 5, wherein said conductive carbon includes carbon nano-tube.

7. A display unit comprising:
a first transparent substrate;
a first transparent electrode formed over said first transparent substrate, wherein said first transparent electrode is formed of carbon nano-tube to reduce width of said first transparent conductive electrode, thereby increasing resolution or improving transmitting rate;
a TFT (thin film transistor) formed over said first transparent electrode, wherein said TFT;
liquid crystals formed over said TFT;
a second transparent electrode formed over said liquid crystals, wherein said second transparent electrode is formed of carbon nano-tube to reduce width of said second transparent conductive electrode, thereby increasing resolution or improving transmitting rate; and
a second transparent substrate formed over said second transparent electrode.

8. The display unit of claim 7, wherein said TFT includes a gate, and an isolation layer is formed over said gate, a conductive carbon material with nano-scale is configured over said isolation and aligned to said gate to act as a channel.

9. The display unit of claim 8, wherein said conductive carbon includes carbon nano-tube.

10. The display unit of claim 7, wherein said TFT further includes a source and a drain (S/D) formed of conductive carbon.

11. The display unit of claim 10, wherein said conductive carbon includes carbon nano-tube.

12. A display unit comprising:
a first transparent substrate having a first transparent electrode formed thereon,
a second transparent substrate having second transparent electrode formed over said first transparent substrate,
wherein at least one of said first and said second transparent electrode is selected from a group consisting of said carbon nano-tube, conductive polymer and the combination thereof, wherein said carbon nano-tube or conductive polymer with nano-scale reduces width of said first, and said second transparent electrode, thereby increasing resolution or improving transmitting rate.

* * * * *

UNITED STATES PATENT AND TRADEMARK OFFICE
CERTIFICATE OF CORRECTION

PATENT NO. : 8,362,490 B2
APPLICATION NO. : 12/880177
DATED : January 29, 2013
INVENTOR(S) : Kuo-Ching Chiang Page 1 of 1

It is certified that error appears in the above-identified patent and that said Letters Patent is hereby corrected as shown below:

On the title page Item (63), under the Related U.S. Application Data Section, cancel the text reciting "Continuation-in-part" and insert --Divisional--.

Signed and Sealed this
Twenty-sixth Day of July, 2016

Michelle K. Lee
*Director of the United States Patent and Trademark Office*